United States Patent
Nagakura

(10) Patent No.: US 6,881,295 B2
(45) Date of Patent: Apr. 19, 2005

(54) AIR-TIGHT VESSEL EQUIPPED WITH GAS FEEDER UNIFORMLY SUPPLYING GASEOUS COMPONENT AROUND PLURAL WAFERS

(75) Inventor: Yutaka Nagakura, Kumamoto (JP)

(73) Assignee: NEC Electronics Corporation (JP)

( * ) Notice: Subject to any disclaimer, the term of this patent is extended or adjusted under 35 U.S.C. 154(b) by 90 days.

(21) Appl. No.: 09/819,516

(22) Filed: Mar. 27, 2001

(65) Prior Publication Data

US 2001/0025605 A1 Oct. 4, 2001

(30) Foreign Application Priority Data

Mar. 28, 2000 (JP) .................................... 2000-089380

(51) Int. Cl.⁷ .................... C23F 1/00; H01L 21/306; C23C 16/00
(52) U.S. Cl. ............. 156/345.33; 118/715; 156/345.29; 204/298.07; 204/298.33
(58) Field of Search ..................... 118/715; 137/561 R; 156/345.33

(56) References Cited

U.S. PATENT DOCUMENTS

| | | | |
|---|---|---|---|
| 3,777,987 A | * | 12/1973 | Allport ........................ 239/452 |
| 5,029,598 A | * | 7/1991 | Stroszynski et al. ........... 137/1 |
| 5,164,012 A | * | 11/1992 | Hattori ........................ 118/725 |
| 5,441,570 A | * | 8/1995 | Hwang ........................ 118/725 |
| 5,500,388 A | * | 3/1996 | Niino et al. .................. 437/89 |
| 5,505,385 A | * | 4/1996 | Gengler et al. ........... 239/553.3 |
| 5,618,349 A | * | 4/1997 | Yuuki ........................ 118/715 |
| 5,704,981 A | * | 1/1998 | Kawakami et al. ......... 118/715 |
| 6,352,084 B1 | * | 3/2002 | Oshinowo .................... 134/82 |

FOREIGN PATENT DOCUMENTS

| | | | | |
|---|---|---|---|---|
| JP | 58-197724 | | 11/1983 | ......... H01L/21/205 |
| JP | 03-228320 | | 9/1991 | ......... H01L/21/205 |
| JP | 03-263824 | | 11/1991 | ......... H01L/21/223 |
| JP | 04-010531 | | 1/1992 | ........... H01L/21/22 |
| JP | 07058030 | * | 3/1995 | ......... H01L/21/205 |
| JP | 07-297132 | | 10/1995 | ......... H01L/21/205 |
| JP | 09-097768 | | 4/1997 | ........... H01L/21/22 |
| JP | 11006068 | * | 1/1999 | ......... C23C/16/044 |

* cited by examiner

Primary Examiner—Parviz Hassanzadeh
Assistant Examiner—Karia Moore
(74) Attorney, Agent, or Firm—Hayes Soloway P.C.

(57) ABSTRACT

A reactor of a chemical vapor deposition system is equipped with a gas feeder for blowing dopant gas to plural semiconductor wafers supported by a wafer boat at intervals, and the gas feeder has a gas passage gradually reduced in cross section and gas outlet holes equal in diameter and arranged along the wafer boat for keeping the doping gas concentration substantially constant around the semiconductor wafers, whereby the dopant is uniformly introduced in material deposited on all the semiconductor wafers.

20 Claims, 4 Drawing Sheets

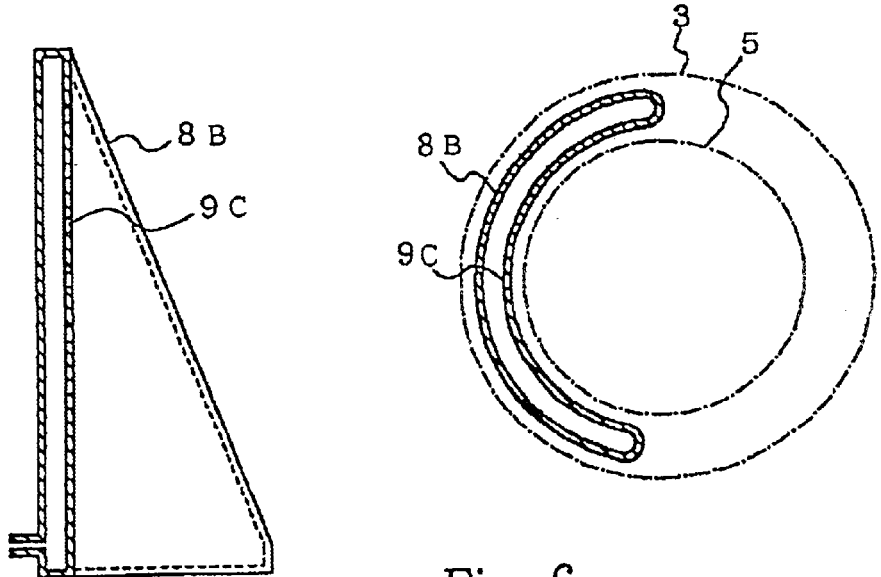
Fig. 6
Fig. 7
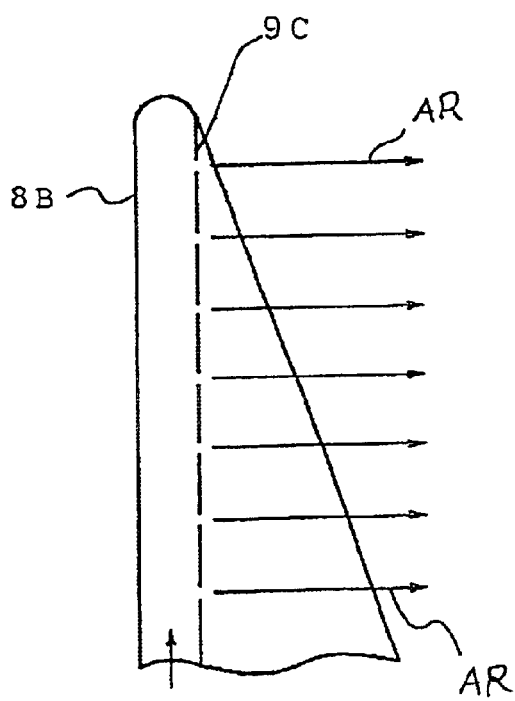
Fig. 8

AIR-TIGHT VESSEL EQUIPPED WITH GAS FEEDER UNIFORMLY SUPPLYING GASEOUS COMPONENT AROUND PLURAL WAFERS

FIELD OF THE INVENTION

This invention relates to a gas treatment system and, more particularly, to a reactor or furnace incorporated in a gas treatment system used in the semiconductor manufacturing field.

DESCRIPTION OF THE RELATED ART

A vertical low-pressure chemical vapor deposition system is popular to the semiconductor manufacturers. FIG. 1 shows a typical example of the vertical low-pressure chemical vapor deposition system. A reactor and a gas supply system (not shown) are incorporated in the prior art vertical low-pressure chemical vapor deposition system.

The prior art reactor includes a base 1, an outer tube 2 and an inner tube 3. The base 1 is fixed to a horizontal foundation (not shown), and is upright thereon. The outer tube 2 is open at one end thereof, and is closed at the other end. The outer tube 2 is larger in diameter than the inner tube 3, and is longer than the inner tube 3. The inner tube 3 is open at both ends thereof. Gas inlet ports are formed in the outer tube 2, and a gas outlet port is further formed in the outer tube 2. The gas inlet ports and the gas outlet port are close to the open end of the outer tube 2, and the gas outlet port is spaced from the gas inlet ports by 180 degrees. The inner tube 3 is partially cut away at one end portion thereof, and a hole is formed in one end portion of the inner tube 3.

The inner tube 3 is fixed to the base 1, and is upright on the base 1. The base 1 closes one end of the inner tube 3. The inner tube 3 is inserted into the outer tube 2 in such a manner that the centerline of the outer tube 2 is coincident with the centerline of the inner tube 3. The outer tube 2 is also fixed to the base 1, and, accordingly, is upright on the base 1. Thus, the inner tube 3 and the outer tube 2 forms a double structure on the base 1.

A cylindrical space is formed between the inner tube 3 and the outer tube 2, and an upper space takes place between the closed end of the outer tube 2 and the other end of the inner tube 3. The cylindrical space is connected through the upper space to the inner space of the inner tube 3, and is further connected through the hole to the inner space of the inner tube 3.

The prior art reactor further comprises a boat holder 4, heaters 7a, 7b and 7c, a gas feeder 8, an exhaust gas pipe 10 and inlet gas pipes 11. The boat holder 4 is fixed to the base 1, and is provided in the inner space of the inner tube 3. The gas feeder 8 is provided in the inner space of the inner tube 3, and vertically extends from the hole toward the other end of the inner tube 3. The heaters 7a, 7b and 7c are provided around the outer tube 2, and, accordingly, the outer tube 2 is wrapped in the heaters 7a, 7b and 7c. The gas supply system is connected through the inlet gas pipes 11 to the inlet gas ports of the outer tube 2. One of the inlet gas pipes is open through the inlet gas port to the cylindrical space, and another inlet gas pipe is open to the hole formed in the inner tube 3. Yet another inlet gas pipe is connected through the inlet gas port to the gas feeder 8, and the exhaust pipe 10 is connected to the gas outlet port of the outer tube 2. Though not shown in FIG. 1, a pressure regulator is connected to the exhaust pipe 10, and the pressure regulator keeps the pressure the in prior art reactor constant.

A wafer boat 5 is put on the boat holder 4, and semiconductor wafers 6 are supported by the wafer boat 5 at intervals. The gas feeder 8 is closed at the other end thereof, and gas outlet holes 9 are formed in the gas feeder 8. The gas outlet holes 9 are equal in diameter, and are constant in density over the gas feeder 8. As described hereinbefore, the gas feeder 8 vertically extends, and gaseous mixture is blown from the gas outlet holes 9 to the semiconductor wafers. The gaseous mixture contains doping gas such as, for example, TMOB (Boron Tri-Methyl Ester) or phosphine, dilute gas such as nitrogen and vapor-phase growing gas such as TEOS (Tetra Ethyl Ortho-Silicate).

The low-pressure chemical vapor deposition is carried out as follows. The semiconductor wafers 6 are supported by the wafer boat 5, and the wafer boat 5 is placed on the boat holder 4. The wafer boat 5 is vertically elongated in the vertical direction along the gas feeder 8, and the gas outlet holes 9 are open to the semiconductor wafers 6 in the boat 5. The heaters 7a, 7b and 7c are energized, and raise the temperature inside the prior art reactor. The gaseous mixture is introduced into the inner space, and is maintained at target pressure. Substance such as, for example, silicon oxide is deposited over the semiconductor wafers 6, and the dopant impurity is in situ introduced into the substance.

A problem is encountered in the prior art reactor in that the layers of deposited substance are different in thickness. Since the gas outlet holes 9 are equal in diameter and constant in density, the pressure gradient takes place inside the gas feeder 8 as indicated by arrows AR in FIG. 2. The arrows AR are representative of the gas pressure. When the gas outlet holes 9 are spaced from the inlet end or the open end, the arrow AR becomes shorter. The lowest arrow AR is the longest of all, and the highest arrow AR is the shortest of all. This is because of the fact that the pressure is reduced from the open end toward the closed end. The higher the gas pressure is, the larger the flow-rate is. As a result, the concentration of the reactant gas is varied with the distance from the lower end of the gas feeder 8. When a large amount of reactant gas is supplied to a semiconductor wafer, the deposition rate is increased. This results in the difference in thickness.

In order to enhance the uniformity of the thickness, the semiconductor wafers 6 are removed from both end portions of the wafer boat 5, and are replaced with dummy wafers. In other words, the chemical vapor deposition is limited to the zone where the deposition rate is constantly controlled by means of the heaters 7a, 7b and 7c. This results in reduction in the zone available for a single chemical vapor deposition. Thus, there is a trade-off between the throughput and the uniformity.

A solution is proposed in Japanese Patent Publication of Unexamined Application No. 58-197724. The prior art chemical vapor deposition system disclosed therein is equipped with a gas feeder 8a, which is corresponding to the gas feeder 8, shown in FIG. 3. The gaseous mixture is blown from the gas feeder 8a to semiconductor wafers supported by a wafer boat. A plurality of gas outlet holes 9a/9b are formed in the prior art gas feeder 8a as similar to the prior art gas feeder 8. However, the gas outlet holes 9a/9b are neither equal to diameter nor constant in density. The diameter is decreased from the open end toward the closed end, and the density of gas outlet holes 9a/9b are increased toward the closed end. The diameter and the density are designed in such a manner that the gas flow rate is constant over the gas feeder 8a. Since the gas concentration of the reactant gas is well controlled over the wafer boat, the deposition rate is substantially constant in the wafer boat.

For this reason, any dummy wafer is not required for the prior art chemical vapor deposition reactor, and the throughput is maintained without sacrifice of the uniformity of the deposited substance.

However, a problem is encountered in the prior art chemical vapor deposition reactor due to the gas outlet holes 9a/9b. In detail, the small gas outlet holes 9a are formed in the vicinity of the closed end of the gas feeder 8a at high density, and the large gas outlet holes 9b are formed in the vicinity of the open end of the gas feeder 8a. The small holes are much more liable to be clogged with the by-products, and the prior art gas feeder 8a requires cleaning frequently. If the cleaning is not frequently repeated, the semiconductor wafers are contaminated with the by-products, and the yield is lowered. Thus, the maintenance work is frequently required for removing the by-products from the prior art gas feeder 8a. On the other hand, the large gas outlet holes 9b makes the prior art gas feeder 8a breakable, because the larger gas outlet holes 9b seriously reduce the surface area of the open end portion of the prior art gas feeder 8a. This means that the prior art gas feeder 8a requires an inspection and a maintenance work at short intervals. Thus, a new problem is encountered in the prior art chemical vapor deposition reactor equipped with the gas feeder 8a in the maintenance works to be carried out at short intervals.

SUMMARY OF THE INVENTION

It is therefore an important object of the present invention to provide a deposition system, a reactor of which permits substance to be uniformly grown on plural semiconductor wafers at high productivity without sacrifice of simplicity of the gas feeder.

To accomplish the object, the present invention proposes to gradually reduce the cross section of a gas passage defined in a gas feeder.

In accordance with one aspect of the present invention, there is provided a gas treatment apparatus comprising an outer tube having a gas inlet port connected to a gas supply system for receiving gas and a gas outlet port connected to an exhaust pipe and defining an inner space, a wafer boat provided in the inner space and holding plural wafers spaced from one another in a predetermined direction, an inner tube provided between the wafer boat and the outer tube and elongated in the predetermined direction, and a gas feeder provided between the inner tube and the wafer boat, connected to the gas inlet port and defining a gas passage gradually reduced in cross section in the predetermined direction and formed with gas outlet holes equal in open area and spaced in the predetermined direction for blowing the gas to the wafers.

In accordance with another aspect of the present invention, there is provided a gas treatment apparatus comprising an air-tight vessel having a gas inlet port connected to a gas supply system, a gas outlet port connected to an exhaust system and an inner space defined therein, a retainer provided in the inner space and retaining plural wafers arranged at intervals and a gas feeder connected at one end portion thereof to the gas inlet port and having a gas passage reduced in cross section from the one end portion toward another end portion of the gas feeder and plural gas outlet holes connected to the gas passage for blowing the gas toward the plural wafers.

BRIEF DESCRIPTION OF THE DRAWINGS

The features and advantages of the reactor will be more clearly understood from the following description taken in conjunction with the accompanying drawings in which:

FIG. 6 is a vertical cross sectional view showing the gas feeder incorporated in the reactor;

FIG. 7 is a horizontal cross sectional view showing the gas feeder incorporated in the reactor; and FIG. 8 is a schematic view showing a dispersion of gas pressure inside of the gas feeder.

DESCRIPTION OF THE PREFERRED EMBODIMENTS

Figure 4:
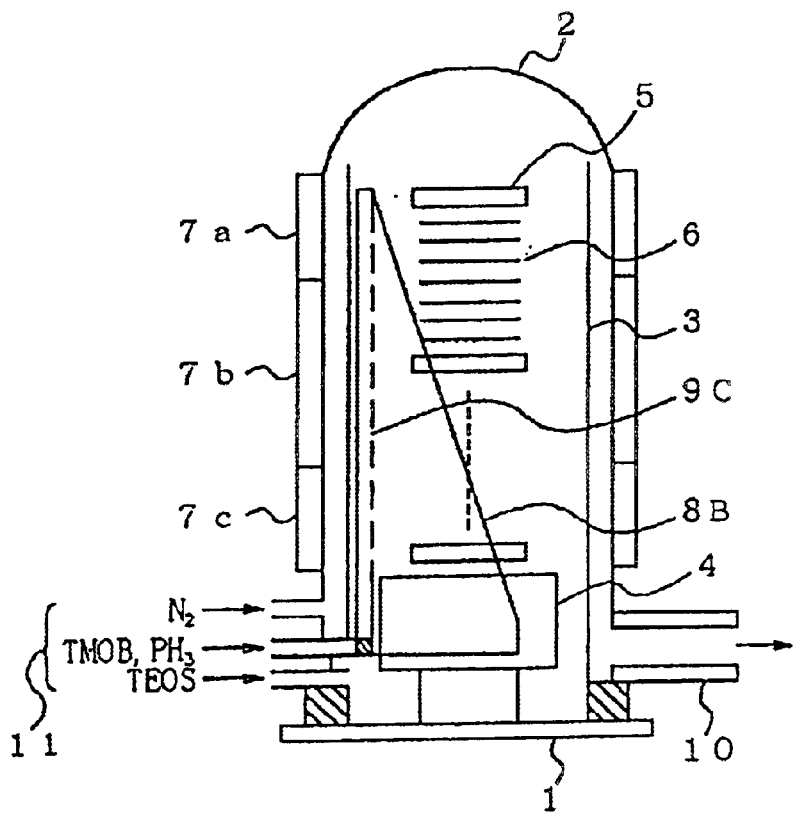
FIG. 4 is a schematic cross sectional view showing a reactor incorporated in a deposition system according to the present invention.
Figure 5:
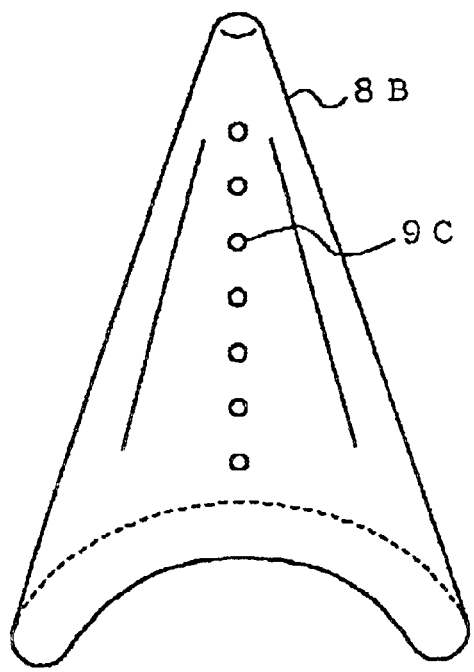
FIG. 5 is a perspective view showing a gas feeder incorporated in the reactor.

Referring to FIG. 4 of the drawings, a vertical low-pressure chemical vapor deposition system largely comprises a gas supply system, a vertical reactor and an exhaust system. The gas supply system includes sources of gas such as $N_2$, TMOB or $PH_3$ and TEOS and gas supply pipes 11, and these kinds of gas are supplied through the supply pipes 11 to the reactor. On the other hand, the exhaust system includes an exhaust pipe 10, a pressure regulator (not shown) and a source of vacuum (not shown) such as, for example, a vacuum pump, and the exhaust system keeps the gas pressure inside of the reactor substantially constant.

Doping gas, dilution gas and reactant gas are supplied from the gas supply system to the reactor. The doping gas may be boron trimethyl ester TMOB or phosphine $PH_3$. The dilution gas may be nitrogen, and the reactant gas for deposited material may be tetraethylorthosilicate TEOS.

The reactor includes a base structure 1. The base structure 1 is broken down into a base plate and a circular rim. The base plate is placed on a horizontal foundation (not shown), and is anchored thereto. The circular rim is fixed to the upper surface of the base plate, and encircles a central area of the upper surface of the base plate.

The reactor further includes an outer tube 2 and an inner tube 3. The outer tube 2 is formed of quartz. The outer tube 2 is broken down into a shell and a head. The shell is tubular, and the head is attached to one end of the shell. For this reason, the outer tube 2 is closed at one end and open at the other end. An inner space is defined in the outer tube 2. A inlet gas port and an outlet gas port are formed in the other end portion of the shell, and the gas inlet pipes 11 and the exhaust pipe 10 are to be connected to the inlet gas port and the outlet gas port, respectively. The shell is straight and constant in diameter. The head has a semi-spherical outer surface and a semi-spherical inner surface, and a recess is defined by the semi-spherical inner surface. The semi-spherical inner surface has a diameter equal to the inner diameter of the shell, and the semi-spherical outer surface has a diameter equal to the outer diameter of the shell. For this reason, the head is connected to the shell without any step therebetween, and prevents the outer tube 2 from the stress concentration. The outer tube 2 is placed on the circular rim of the base structure 1, and is air-tightly connected to the rim of the base stricture 1. Thus, the outer tube 2 is upright on the base structure 1, and an inner space is defined inside the outer tube 2.

The inner tube 3 has a tubular configuration, and is less in diameter than the shell of the outer tube 2. The inner tube 3 is constant in inner diameter, and is shorter than the outer tube 2. No head is attached to the inner tube 3, and, accordingly, the inner tube 3 is open at both ends thereof. The inner tube 3 is provided inside the outer tube 2, and is connected to the base structure 1. The inner tube 3 is upright on the base plate of the base structure 1. A gap exists between the inner tube 3 and the outer tube 2, and the inlet gas port and the outlet gas port are open to the tubular space between the inner tube 3 and the outer tube 2. An opening is formed in one end portion of the inner tube 3, and is close to the circular rim of the base structure 1. The tubular space is connected to the inner space inside of the inner tube 3 through the opening.

The reactor further included a boat holder 4, heaters 7a, 7b and 7c and a gas feeder 8B. The boat holder 4 is provided inside the inner tube 3, and is placed on the base plate of the base structure 1. A tubular space exists between the inner tube 3 and the wafer boat 5. The boat holder 4 is fixed to the base structure 1, and a water boat 5 is to be put on the boat holder 4. The semiconductor wafers 6 are supported by the wafer boat 5. The wafer boat 5 is elongated in the vertical direction on the boat holder 4, and semiconductor wafers 6 are spaced from one another in the wafer boat 5 in the vertical direction on the boat holder 4.

The heaters 7a, 7b and 7c are attached to the shell of the outer tube 2, and are connected to a controller (not shown). The heater 7a is attached to the upper portion of the shell, the heater 7b is attached to the intermediate portion of the shell, and the heater 7c is attached to the lower portion of the shell. The heaters 7a, 7b and 7c are independently energized so as to control the temperature inside of the reactor. The heaters 7a, 7b and 7c may make the temperature inside of the reactor substantially constant. If a temperature gradient is required, the controller energizes the heaters 7a, 7b and 7c differently.

The gas feeder 8B is provided in the tubular space between the inner tube 3 and the wafer boat 5, and vertically extends along the wafer boat 5. An inner space is defined in the gas feeder 8B, and also extends along the wafer boat 5. The gas supply system is connected through the gas inlet port to the gas feeder 8B, and the gas inlet port is formed at the lower end portion of the gas feeder 8B. The upper end portion of the gas feeder 8B is closed, and gas outlet holes 9C are formed at regular intervals in the intermediate portion of the gas feeder 8B. The gas outlet holes 9 are vertically spaced from one another, and are directed to the wafer boat 5.

The inner space in the gas feeder 8B is gradually decreased in horizontal cross section from the lower end portion toward the upper end portion. Cones, frustums of cones, pyramids and frustums of pyramids are typical examples of the configuration gradually decreased in the cross section. However, it is impossible to place a cone-shaped or a pyramidal gas feeder inside the inner tube 3, because most of the inner space is occupied by the wafer boat 5. For this reason, the gas feeder 8B is shaped into a part of the peripheral portion of a frustum of cone as shown in FIGS. 6 and 7. When a circular cylinder is pressed against a frustum of conical tube, the frustum of conical tube is inwardly depressed, and the resultant configuration is similar to that of the gas feeder 8B. The cross section is like a crescent (see FIG. 7). A convex surface, a concave surface and a pair of semi-cylindrical surfaces, an upper surface and bottom surface form the gas feeder 8B. The gas outlet holes 9C are formed in the concave surface along a virtual line, which is substantially in parallel to the vertical centerline of the wafer boat 5.

Figure 1:
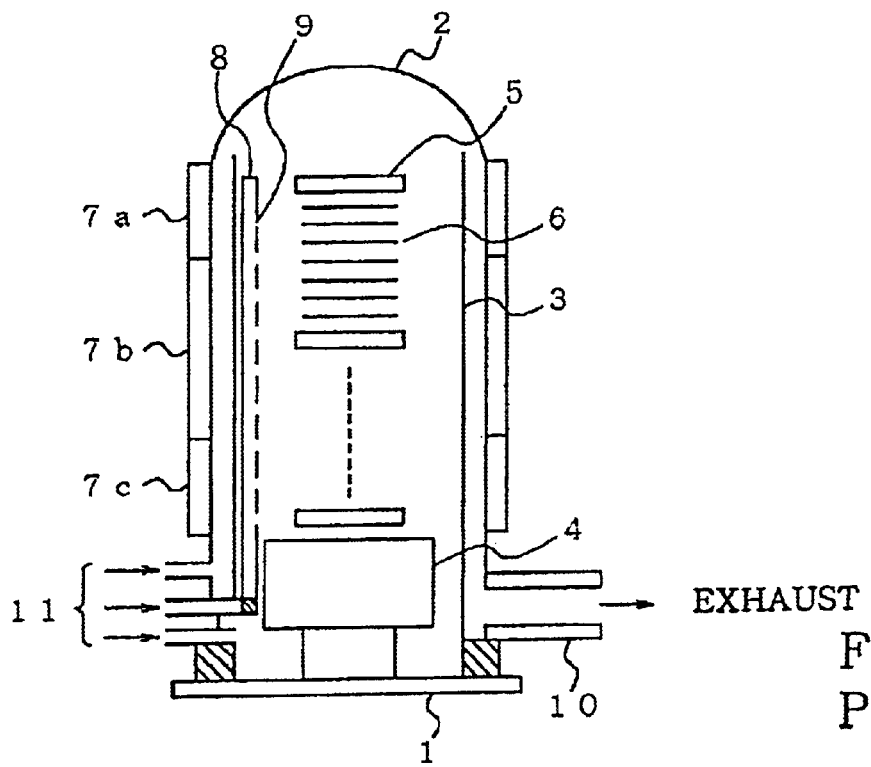
FIG. 1 is a schematic cross sectional view showing the structure of the prior art reactor.
Figure 2:
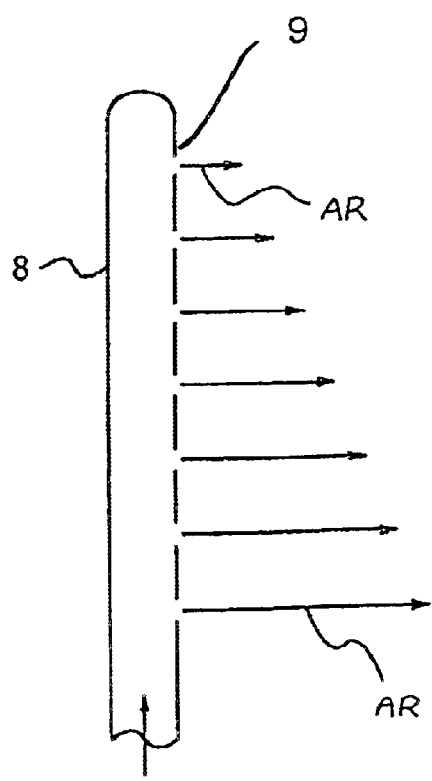
FIG. 2 is a schematic cross sectional view showing the gas feeder incorporated in the prior art diffusion reactor.
Figure 3:
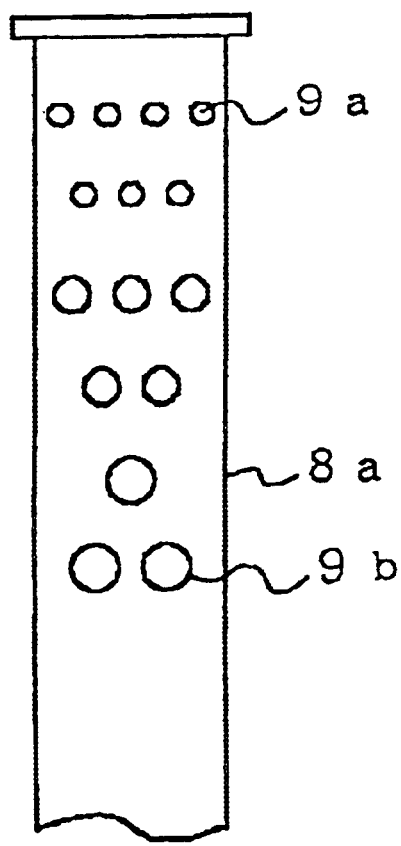
FIG. 3 is a front view showing the gas feeder incorporated in the prior art chemical vapor deposition reactor disclosed in Japanese Patent Publication of Unexamined Application No. 58-197724.

The gas outlet holes 9C are equal in diameter, and are spaced at regular intervals. The diameter of the gas outlet holes 9C is greater than that of the small gas outlet holes 9a formed in the upper end portions of the gas feeder 8a, and is less than that of the large gas outlet holes 9b formed in the lower portion of the gas feeder 8a of the prior art FIG. 3. For this reason, the gas outlet holes 9C are easily formed in the gas feeder 8B, and are less liable to be clogged with the by-products. The inner space of the gas feeder 8B has a horizontal cross section, which is gradually decreased in area from the lower end toward the upper end. The inner space is designed in such a manner as to eliminate the pressure gradient from the gas in the inner space of the gas feeder 8B. In other words, the gas pressure at all of the gas outlet holes 9C is constant regardless of the position of the gas outlet holes 9C as indicated by arrows (see FIG. 8). Since the gas outlet holes 9C are equal in diameter to one another, the amount of gas blowing out from each gas outlet hole 9C is approximately equal to that blowing out from another of the gas outlet holes 9C. In this instance, the doping gas is supplied from the gas supply system to the gas feeder 8B, and is blown to the semiconductor wafers 6 in the wafer boat 5 for in-situ doping. The gas feeder 8B uniformly supplies the doping gas to the semiconductor wafers 6, and the dopant is uniformly introduced into the substance deposited on all the semiconductor wafers 6.

Assuming now that phospho-silicate glass is to be uniformly deposited on all semiconductor wafers 6, the heaters 7a, 7b and 7c raises the temperature inside the reactor, and the pressure regulator (not shown) regulates the internal gas at a target pressure. The heaters 7a, 7b and 7c keeps the gas at the target temperature, and the pressure regulator (not shown) keeps the internal gas at the target pressure. The reactant gas TEOS, the doping gas such as $PH_3$ and the dilution gas $N_2$ are supplied from the gas supply system through the gas pipes 11 to the reactor. The reactant gas TEOS is decomposed so that silicon oxide is deposited over the semiconductor wafers 6. The doping gas $PH_3$ is supplied through the gas inlet port to the gas feeder 8B, and is blown to the silicon oxide grown on the semiconductor wafers 6. The phosphorous is introduced into the silicon oxide, and the phospho-silicate glass is grown on the semiconductor wafers 6. Since the doping gas concentration is constant around the semiconductor wafers 6 in the wafer boat 5, the phosphorous concentration is constant in the phospho-silicate glass deposited on all the semiconductor wafers 6.

In the above-described embodiment, the wafer holder 5 serves as a retainer, and said outer tube 2 and said inner tube 3 as a whole constitute an air-tight vessel.

Although particular embodiments of the present invention have been shown and described, it will be apparent to those skilled in the art that various changes and modifications may be made without departing from the spirit and scope of the present invention.

The gas feeder 8B may be shaped into all the peripheral portion of a cone. In this instance, the wafer boat 5 is encircled with the gas feeder 8B. The gas feeder 8B maybe shaped into a part of or all of the peripheral portion of a pyramid.

Reactant gas may be supplied to the gas feeder 8B. In this instance, the reactant gas concentration is uniform around the semiconductor wafers 5 in the wafer boat 5, and the growth rate is constant on all the semiconductor wafers regardless of the position in the wafer boat 5.

The gas feeder 8B may be incorporated in a thermal diffusion furnace. In this instance, the dopant gas concentration is uniform around all the semiconductor wafers 5, and the manufacturer achieves a target impurity profile in all the semiconductor wafers.

What is claimed is:

1. A gas treatment apparatus comprising:
   an outer tube having gas inlet port connected to a gas supply system receiving gas and a gas outlet port connected to an exhaust pipe, and defining an inner space;
   a wafer boat provided in said inner space and holding plural wafers spaced from one another in a predetermined direction;
   an inner tube provided between said wafer boat and said outer tube and elongated in said predetermined direction; and
   a gas feeder provided between said inner tube and said wafer boat, connected to a said gas inlet port and defining a gas passage gradually reduced in cross section in said predetermined direction, and formed with a plurality of like gas outlet holes equal in open area and equally spaced in said predetermined direction for blowing said gas to said wafers,
   wherein said gas feeder has a narrow end surface, a wide end surface, a convex outer surface extending between said narrow end surface and said wide end surface, a concave inner surface extending between said narrow end surface and said wide end surface and spaced from said convex outer surface and semi-cylindrical side surfaces connected between one of the side lines of said convex outer surface and one of the side lines of said concave inner surface and between the other of said side lines of said convex outer surface and the other of said side lines of said concave inner surface, and said gas inlet port is connected to said gas feeder at a position closer to said wide end surface than said narrow end surface.

2. The gas treatment apparatus as set forth in claim 1, wherein said gas outlet holes are formed in said inner concave surface on a virtual line extending from said wide end surface toward said narrow end surface.

3. The gas treatment apparatus as set forth in claim 1, wherein said outer convex surface and said inner concave surface are opposed to the inner surface of said outer tube and said wafer boat, respectively, and said gas outlet holes are formed in said inner concave surface.

4. The gas treatment apparatus as set forth in claim 2, wherein said virtual line is a generating line of said concave inner surface, and is substantially in parallel to a centerline of said wafer boat.

5. The gas treatment apparatus as set forth in claim 1, wherein said wide end surface has a generally crescent shape.

6. A gas treatment apparatus comprising:
   an air-tight vessel having a gas inlet port connected to a gas supply system, a gas outlet port connected to an exhaust system and an inner space defined therein;
   a retainer provided in said inner space and retaining plural wafers arranged at intervals; and
   a gas feeder connected at one end portion thereof to said gas inlet port and having a gas passage reduced in cross section from said one end portion toward another end portion of said gas feeder and a plurality of like gas outlet holes equal in open area and equally spaced along a virtual line connected to said gas passage for blowing said gas toward said plural wafers,
   wherein said gas feeder has a narrow end surface, a wide end surface, a convex outer surface extending between said narrow end surface and said wide end surface, a concave inner surface extending between said narrow end surface and said wide end surface and spaced from said convex outer surface and semi-cylindrical side surfaces connected between one of the side lines of said convex outer surface and one of the side lines of said concave inner surface and between the other of said side lines of said convex outer surface and the other of said side lines of said concave inner surface, and said gas inlet port is connected to said gas feeder at a position closer to said wide end surface than said narrow end surface.

7. The gas treatment apparatus as set forth in claim 6, wherein said gas outlet holes are formed in said inner concave surface on a virtual line extending from said wide end surface toward said narrow end surface.

8. The gas treatment apparatus as set forth in claim 6, wherein said outer convex surface and said inner concave surface are opposed so an inner surface of said air-tight vessel and said retainer, respectively, and said gas outlet holes are formed in said inner concave surface.

9. The gas treatment apparatus as set forth in claim 7, wherein said virtual line is a generating line of said concave inner surface, and is substantially in parallel to a centerline of said retainer.

10. The gas treatment apparatus as set forth in claim 6, wherein said wide end surface has a generally crescent shape.

11. A gas treatment apparatus comprising:
    an outer tube having a gas inlet port connected to a gas supply system for receiving gas and a gas outlet port connected to an exhaust pipe, and defining an inner space;
    a wafer boat having a circumference provided in said inner space and holding plural wafers spaced from one another in a predetermined direction;
    an inner tube provided between said wafer boat and said outer tube and elongated in said predetermined direction; and
    a gas feeder provided between said inner tube and said wafer boat extending partially around the circumference of the wafer boat, connected to a said gas inlet port and defining a gas passage gradually reduced in cross section in said predetermined direction, and formed with a plurality of like gas outlet holes equal in open area and equally spaced in said predetermined direction for blowing said gas to said wafers,
    wherein said gas feeder has a narrow end surface, a wide end surface, a convex outer surface extending between said narrow end surface and said wide end surface, a concave inner surface extending between said narrow end surface and said wide end surface and spaced from said convex outer surface and semi-cylindrical side surfaces connected between one of the side lines of said convex outer surface and one of the side lines of said concave inner surface and between the other of said side lines of said convex outer surface and the other of said side lines of said concave inner surface, and said gas inlet port is connected to said gas feeder at a position closer to said wide end surface than said narrow end surface.

12. The gas treatment apparatus as set in forth in claim 11, wherein said gas outlet holes are formed in said inner concave surface on a virtual line extending from said wide end surface toward said narrow end surface.

13. The gas treatment apparatus as set forth in claim 11, wherein said outer convex surface and said inner concave surface are opposed to the inner surface of said outer tube and said wafer boat, respectively, and said gas outlet holes are formed in said inner concave surface.

14. The gas treatment apparatus as set forth in claim 12, wherein said virtual line is a generating line of said concave inner surface, and is substantially in parallel to a centerline of said wafer boat.

15. The gas treatment apparatus as set forth in claim 11, wherein said wide end surface has a generally crescent shape.

16. A gas treatment apparatus comprising:

an air-tight vessel having a gas inlet port connected to a gas supply system, a gas outlet port connected to an exhaust system and an inner space defined therein;

a retainer having a circumference provided in said inner space and retaining plural wafers arranged at intervals; and a gas feeder connected at one end portion thereof to said gas inlet port and having a gas passage reduced in cross section from said one end portion toward another end portion of said gas feeder and a plurality of like gas outlet holes equal in open area and equally spaced along a virtual line connected to said gas passage for blowing said gas toward said plural wafers, said gas feeder extending partially around the circumference of the retainer, wherein said gas feeder has a narrow end surface, a wide end surface, a convex outer surface extending between said narrow end surface and said wide end surface, a concave inner surface extending between said narrow end surface and said wide end surface and spaced from said convex outer surface and semi-cylindrical side surfaces connected between one of the side lines of said convex outer surface and one of the side lines of said concave inner surface and between the other of said side lines of said convex outer surface and the other of said side lines of said concave inner surface, and said gas inlet port is connected to said gas feeder at a position closer to said wide end surface than said narrow end surface.

17. The gas treatment apparatus as set forth in claim 16, wherein said gas outlet holes are formed in said inner concave surface on a virtual line extending from said wide end surface toward said narrow end surface.

18. The gas treatment apparatus as set forth in claim 16, wherein said outer convex surface and said inner concave surface are opposed to an inner surface of said air-tight vessel and said retainer, respectively, and said gas outlet holes are formed in said inner concave surface.

19. The gas treatment apparatus as set forth in claim 17, wherein said virtual line is a generating line of said concave inner surface, and is substantially in parallel to a centerline of said retainer.

20. The gas treatment apparatus as set forth in claim 16, wherein said wide end surface has a generally crescent shape.

* * * * *